US008648595B2

(12) United States Patent
Blumhagen et al.

(10) Patent No.: US 8,648,595 B2
(45) Date of Patent: Feb. 11, 2014

(54) DETERMINING A POSITION OF A SUBAREA OF AN OBJECT UNDER EXAMINATION AND THE STRUCTURE THEREOF IN A MAGNETIC RESONANCE SYSTEM

(75) Inventors: Jan Ole Blumhagen, Nuremberg (DE); Matthias Fenchel, Erlangen (DE); Ralf Ladebeck, Erlangen, DE (US)

(73) Assignee: Siemens Aktiengesellschaft, Munich (DE)

( * ) Notice: Subject to any disclaimer, the term of this patent is extended or adjusted under 35 U.S.C. 154(b) by 473 days.

(21) Appl. No.: 13/015,065

(22) Filed: Jan. 27, 2011

(65) Prior Publication Data

US 2011/0187364 A1   Aug. 4, 2011

(30) Foreign Application Priority Data

Feb. 1, 2010 (DE) .................. 10 2010 006 431

(51) Int. Cl.
*G01V 3/00* (2006.01)
(52) U.S. Cl.
USPC .......................................... 324/309; 324/307
(58) Field of Classification Search
USPC .................... 324/309, 307, 306, 312
See application file for complete search history.

(56) References Cited

U.S. PATENT DOCUMENTS

| 7,312,610 | B2 | 12/2007 | Harder |
| 7,388,376 | B2 * | 6/2008 | Heid et al. ................ 324/307 |
| 7,791,340 | B2 | 9/2010 | Heid |
| 7,835,781 | B2 | 11/2010 | Ladebeck et al. |
| 8,280,487 | B2 * | 10/2012 | Wohlfarth ................ 600/415 |
| 2011/0080168 | A1 * | 4/2011 | Fenchel et al. ............. 324/309 |
| 2012/0056621 | A1 * | 3/2012 | Blumhagen et al. ......... 324/309 |
| 2013/0057282 | A1 * | 3/2013 | Blumhagen et al. ......... 324/309 |

FOREIGN PATENT DOCUMENTS

| DE | 19627503 A1 | 3/1997 |
| DE | 102004026616 B4 | 9/2007 |
| DE | 102006036572 A1 | 2/2008 |
| DE | 102007027170 A1 | 12/2008 |

OTHER PUBLICATIONS

Doran S.J.; A complete distortion correction for MR images; Phys. Med. Biol. 50 (2005), S. 1343-1361 (Epub Mar. 16, 2005); Others; 2005.
Langlois S. et al.; MIR Geometric Distortion: A Simple Approach to Correcting the Effects of Non-Linear Gradient Fields, JMRI 9: pp. 821-831, 1999; Magazine.

(Continued)

*Primary Examiner* — Louis Arana
(74) *Attorney, Agent, or Firm* — Harness, Dickey & Pierce, P.L.C.

(57) ABSTRACT

A method is disclosed for determining a location of a subarea of an area under examination in a magnetic resonance system. The subarea is arranged at the edge of a field-of-view of the magnetic resonance system. In at least one embodiment of the method, at least one slice position is determined for an MR image in which the $B_0$ field at the edge of the MR image satisfies a homogeneity value. For the slice position determined an MR image is acquired which contains the subarea at the edge of the field-of-view and the location of the subarea of the object under examination is determined through the location of the subarea in the MR image.

20 Claims, 10 Drawing Sheets

(56) References Cited

OTHER PUBLICATIONS

Gaspar Delso et al.: "Impact of limited MR field-of-view in simultaneous PET/MR acquisition"; The Journal of Nuclear Medicine, 2008; 49; 162P; http://jnumedmtg.snmjournals.org/cgi/content/meeting_abstract/49/MeetingAbstracts_1/162P-b; Others; 2008.

Reinsberg et al, "A complete distortion correction for MR images: II. Rectification of static-field inhomogeneities by similarity-based profile mapping", Phys Med. Biol. Jun. 7, 2005; 50(11):2651-61; Others; 2005.

German Office Action dated Sep. 27, 2010 for German Patent Application No. 10 2010 006 431.9.

German Patent Publication No. 10 2010 006 431.9 filed on Feb. 1, 2010 (not yet published).

* cited by examiner

DETERMINING A POSITION OF A SUBAREA OF AN OBJECT UNDER EXAMINATION AND THE STRUCTURE THEREOF IN A MAGNETIC RESONANCE SYSTEM

PRIORITY STATEMENT

The present application hereby claims priority under 35 U.S.C. §119 on German patent application number DE 10 2010 006 431.9 filed Feb. 1, 2010, the entire contents of which are hereby incorporated herein by reference.

FIELD

At least one embodiment of the present invention generally relates to a method for determining a position of a subarea of an object under examination and the structure of the object in a magnetic resonance system and to a magnetic resonance system for this purpose.

BACKGROUND

The measurable volume of a magnetic resonance tomography image is restricted in all three spatial directions because of physical and technical conditions, such as a restricted magnetic field homogeneity and a non-linearity of the gradient field for example. Thus an image volume, a so-called field-of-view (FoV), is restricted to a volume in which the above-mentioned physical features lie within a predetermined range of tolerance and thus a faithful image of the object under examination is possible with normal measurement sequences. This field-of-view is however significantly smaller, especially in the x and y direction, i.e. at right angles to a longitudinal axis of a tunnel of a magnetic resonance system than the volume restricted by the ring tunnel of the magnetic resonance system. With usual magnetic resonance systems a diameter of the ring tunnel typically amounts to 600 mm, whereas the diameter of the field-of-view normally used, in which the above physical features lie within the range of tolerance, amounts to approximately 500 mm.

The problem of not being able to produce a faithful image in the edge area of the tunnel of the magnetic resonance system is usually resolved for pure magnetic resonance images by the area of the object under examination not being arranged at the edge of the tunnel but where possible in the center of the tunnel, referred to as the isocenter of the magnetic resonance system. With hybrid systems, such as a hybrid system consisting of a magnetic resonance tomograph and a positron emission tomograph for example, known as an MR-PET hybrid system, it is however frequently of decisive importance also to determine structures in the edge area as precisely as possible. In an MR-PET hybrid system human attenuation correction is of decisive importance for example. Human attenuation correction determines the attenuation of the intensity of the photons emitted after interaction between positrons and electrons on their path through absorbent tissue to the detector and corrects the received signal by just this attenuation. For this purpose a magnetic resonance image is acquired which shows the complete anatomy of the object under examination in the direction of the high-energy photons emitted by the positron emission tomography. This means that the anatomy of the object under examination is also to be detected as accurately as possible in the edge area of the tunnel of the hybrid system. The structures located in this area are typically primarily the arms of a patient to be examined, which can be arranged in the edge area close to a tunnel inner wall of the hybrid system.

In the prior art, a method has thus been proposed by Delso et al, to compensate for the information missing as a result of the field-of-view limitation in the MR image, by segmenting the body contours using uncorrected PET data (G. Delso, et al, Impact of limited MR field-of-view in simultaneous PET/MR acquisition, *Journal of Nuclear Medicine Meeting Abstracts*, 2008; 49: 162P). Since the field-of-view of a magnetic resonance system is limited to a volume in which the magnetic field inhomogeneity and the non-linearity of the gradient field lies within specific ranges, various correction algorithms have been provided in the prior art in order to extend the field-of-view. Thus in Langlois S. et al, MRI Geometric Distortion: a simple approach to correcting the effects of non-linear gradient fields, *Journal of Magnetic Resonance Imaging* 1999, 9(6), 821-31 and in Doran et al, A complete distortion correction for MR images, I. Gradient warp correction, *Phys Med Biol.* 2005 April 7, 50(7), 1343-61 a gradient warp correction is proposed. Furthermore in Reinsberg et al, A complete distortion correction for MR images: II. Rectification of static-field inhomogeneities by similarity-based profile mapping, *Phys Med. Biol.* 2005 June 7; 50(11):2651-61 a corresponding $B_0$ field correction is proposed.

SUMMARY

A specific field-of-view extension for application in a whole-body MR-PET is however not known in the prior art. In at least one embodiment of the present invention, a suitable faithful imaging of structures of an object under examination in an area outside the usual field-of-view is provided, i.e. in an edge area of a ring tunnel of the magnetic resonance system for example, especially for a whole-body MR-PET.

In at least one embodiment, a method is disclosed for determining a position of a subarea of an object under examination in a magnetic resonance system. At least one embodiment is directed to a magnetic resonance system. At least one embodiment is directed to a computer program product and/or an electronically-readable data medium. The independent claims define preferred and advantageous forms of embodiment of the present invention.

In accordance with at least one embodiment of the present invention, a method is provided for determining a location of a subarea of an object under examination, such as a patient for example, in a magnetic resonance system. The subarea of the object under examination is arranged at the edge of the field-of-view of the magnetic resonance system. In the method at least one slice position for an MR image is determined automatically in which the $B_0$ field at the edge of the MR image fulfills a predetermined homogeneity criterion. Furthermore an MR image is acquired in the specific slice position containing the subarea at the edge of the field-of-view. The location of the subarea of the object under examination is determined automatically by the location of the subarea in the MR image acquired.

The physical and technical conditions mentioned above, for example a magnetic field inhomogeneity, usually obtain not in the entire edge area of the field-of-view of the magnetic resonance system but differ greatly in the edge area of the field-of-view, depending on the position. By first determining a few slice positions in which the $B_0$ field at the edge of the MR image fulfills a predetermined homogeneity criterion a few selected slice positions are defined in which MR images are acquired which even in the edge area can deliver a faithful image of the object under examination. Since with normal objects under examination, such as a patient for example, the subareas of the patient which are located in the edge areas, for example the arms of the patient, extend continuously in the edge area, on the basis of information from the previously determined MR images and the selected slice positions the entire location of these subareas, e.g. the arms, can be determined. The arms of the patient can be viewed for example as cylindrical structures so that individual MR images which represent transversal slice images of the arms in images acquired at intervals are sufficient to detect the structure of the arms as a whole. A restriction to individual and thus few slices for the MRI images to be acquired also allows higher gradient strengths at a predetermined maximum specific absorption rate (SAR), which enables a distortion in the slice images acquired to be further reduced.

In accordance with a form of embodiment the MR image is acquired in a first slice and to determine the at least one slice position for the MR image in which the $B_0$ field at the edge of the MR image fulfills the predetermined homogeneity criterion, a further MR image is acquired beforehand in a second slice plane. In the further MR image at least one slice position for the MR image is determined in which the signal values at the edge of the further MR image fulfill a predetermined signal value criterion. The second slice plane can for example be a coronal plane of the object under examination. The first slice plane can for example be a sagittal or transversal plane of the object under examination.

Since the magnetic field strength of the $B_0$ field at the edge of the field-of-view periodically increases and decreases spatially there are positions in which the field strength of the $B_0$ field is approximately equal to the magnetic field strength in the normally used field-of-view or in the isocenter of the magnetic resonance system respectively. These positions can be found for example in an MR image in a coronal plane of the object under examination by signal values for the subarea of the object under examination being detected at the edge of the field-of-view.

These signal values typically only exceed a predetermined threshold value if the magnetic field strength of the $B_0$ field in this area approximately corresponds to the $B_0$ field in the isocenter. Furthermore these signal values can also be compared with adjacent signal values and slice positions thus found in which the signal values lie within a predetermined signal value relationship to the adjacent signal values. The adjacent signal values can for example be signal values which lie in adjacent slices or further in the direction of the isocenter. Consequently slice positions for MR images in a transversal plane or sagittal plane for example can be determined from the MR image in the coronal plane, in which the $B_0$ field at the edge of the MR image is sufficiently homogenous. In this way the acquisition of the MR image in the second slice plane (e.g. coronal plane) enables the planning of further MR images in the first slice plane (e.g. transversal plane) to be carried out automatically.

In accordance with a further form of embodiment, to determine the at least one slice position for the MR image, in which the $B_0$ field at the edge of the MR image fulfills the presepecified homogeneity criterion, a number of MR images are recorded beforehand in slice planes which are parallel to the slice plane of the MR image, for example a number of MR images in sagittal or transversal planes. Then the edge areas of the number of MR images are examined and those of the number of MR images are identified in which the signal values at the edge fulfill a predetermined signal value criterion. To do this the signal values at the edge can typically be compared to a threshold value. The signal values only exceed the predetermined threshold value for example if the magnetic field strength of the $B_0$ field in this area approximately corresponds to the $B_0$ field in the isocenter. In addition these signal values can also typically be compared to adjacent signal values and in this way slice positions can be found in which the signal values at the edge lie within a predetermined signal value relationship to the adjacent signal values.

The adjacent signal values can typically be signal values which lie in adjacent slices or further in the direction of the isocenter. The number of MR images can for example be acquired with a reduced resolution since they are merely used for planning the actual MR imaging. The acquisition planes of the number of MR images can be selected iteratively, with the procedure starting with a rough grid which is then iteratively refined. Thus suitable slice positions for the MR images in for example a transversal plane or sagittal plane in which the $B_0$ field at the edge of the MR image is sufficiently homogeneous can be determined from the number of MR images. In this way planning can be undertaken automatically for the MR images in which the $B_0$ field at the edge of the MR images sufficiently homogeneous and which can then be acquired at higher resolution by accepting the number of MR images.

In a further form of embodiment, for determining the at least one slice position for the MR image in which the $B_0$ field at the edge of the MR image fulfills the predetermined homogeneity criterion, a $B_0$ field distribution in the field-of-view including the edge of the field-of-view is determined. This determination can for example be undertaken by automatically measuring the $B_0$ field in the overall tunnel of the magnetic resonance system. The measured values can then for example be stored in a control unit of the magnetic resonance system and be evaluated for determining the slice position for, the MR image. This makes it possible, even without the previously described measurement in for example the coronal slice, to determine slice positions for MR images which can be used to determine the location of the subarea of the object under examination at the edge of the field-of-view.

As previously described, the subarea of the object under examination can include a structure of a patient, for example an arm of the patient, which is arranged at the edge of the field-of-view of the magnetic resonance system. As a result of prior knowledge of the structure, for example the cylindrical structure of the arm of the patient, the determination of the location of the structure in the magnetic resonance system can be easily undertaken by analyzing the few MR images acquired at intervals.

In accordance with one form of embodiment the magnetic resonance system includes a tunnel-shaped opening for acquiring images of the object under examination and the edge of the field-of-view includes an inner casing area along with the inner surface of the tunnel-shaped opening. The inner casing area can for example have a casing thickness of approximately 5 cm. In the normal magnetic resonance system with a tunnel-shaped opening of typically around 60 cm in diameter, the $B_0$ field is usually homogenous in a spherical area with a diameter of approximately 50 cm. In the inner casing area of for example 5 cm in thickness however the $B_0$ field increases and decreases spatially periodically. The fact that slice positions for an MR image are determined in which the $B_0$ field at the edge of the MR image is more homogenous than a predetermined threshold value, also enables MR images to be acquired for the inner casing area in the specific layer positions in a transversal plane for example. The location of the subarea of the object under examination, for example of an arm of the patient, can then be reliably determined from these MR images in the transversal plane through the location of the subarea in the acquired MR images.

In accordance with a further form of embodiment an attenuation correction is determined for a positron emission tomography as a function of the defined position of the subarea of the object under examination. In positron emission tomography it is decisively important to take account of attenuation of the received radiation (photons) through the structure or anatomy of the object under examination in the beam direction. The fact that the location of the subarea of the object under examination can be determined at the edge of the field-of-view of the magnetic resonance system by the location of the subarea in the MR images determined means that the overall determination of the location and structure of the object under examination in the magnetic resonance system is possible and thus a precise attenuation correction for a positron emission tomography is possible. Since the attenuation correction is solely based on information from the MR images, a positron emission tomography is also able to be undertaken with fewer strongly enhanced PET tracers such as rubidium for example.

Likewise the determination of the position of the subarea of the object under examination at the edge of the field-of-view of the magnetic resonance system makes it possible to support radiotherapy planning.

In accordance with at least one embodiment of the present invention a magnetic resonance system is also provided which includes a control unit for controlling a tomograph with a magnet for creating a $B_0$ field, a receive device for receiving the signals acquired by tomograph and an evaluation unit for evaluating the signals and creating MR images. The magnetic resonance system is able to determine at least one slice position for an MR image, in which the $B_0$ field at the edge of the MR image fulfills a predetermined homogeneity criterion. Furthermore the magnetic resonance system is suitable for acquiring an MR image in the slice position determined. The MR image contains a subarea of an object under examination at the edge of the field-of-view of the magnetic resonance system. From the location of the subarea in the MR image the magnetic resonance system determines the location of the subarea of the object under examination in the magnetic resonance system.

The magnetic resonance system can also determine a positron emission tomograph and an attenuation correction for positron emission tomography as a function of the determined location of the subarea of the object under examination in the magnetic resonance system.

Furthermore the magnetic resonance system can be designed for carrying out at least one embodiment of the method described above and its forms of embodiments and thus includes the previously described benefits.

At least one embodiment of the present invention also provides a computer program product, especially software, which can be loaded into a memory of a programmable control of a magnetic resonance system. All previously described forms of embodiment of the inventive method can be executed with program elements of this computer program product when the computer program product is executed in the magnetic resonance system.

At least one embodiment of the present invention also provides an electronically-readable data medium, e.g. a CD or DVD, on which electronically-readable control information, especially software, is stored. If this control information is read from the data medium and stored in a control unit of the magnetic resonance system, all inventive forms of embodiment of the previously described method can be executed with the magnetic resonance system.

BRIEF DESCRIPTION OF THE DRAWINGS

The present invention will be described below on the basis of example forms of embodiment which refer to the drawings.

DETAILED DESCRIPTION OF THE EXAMPLE EMBODIMENTS

Figure 1:
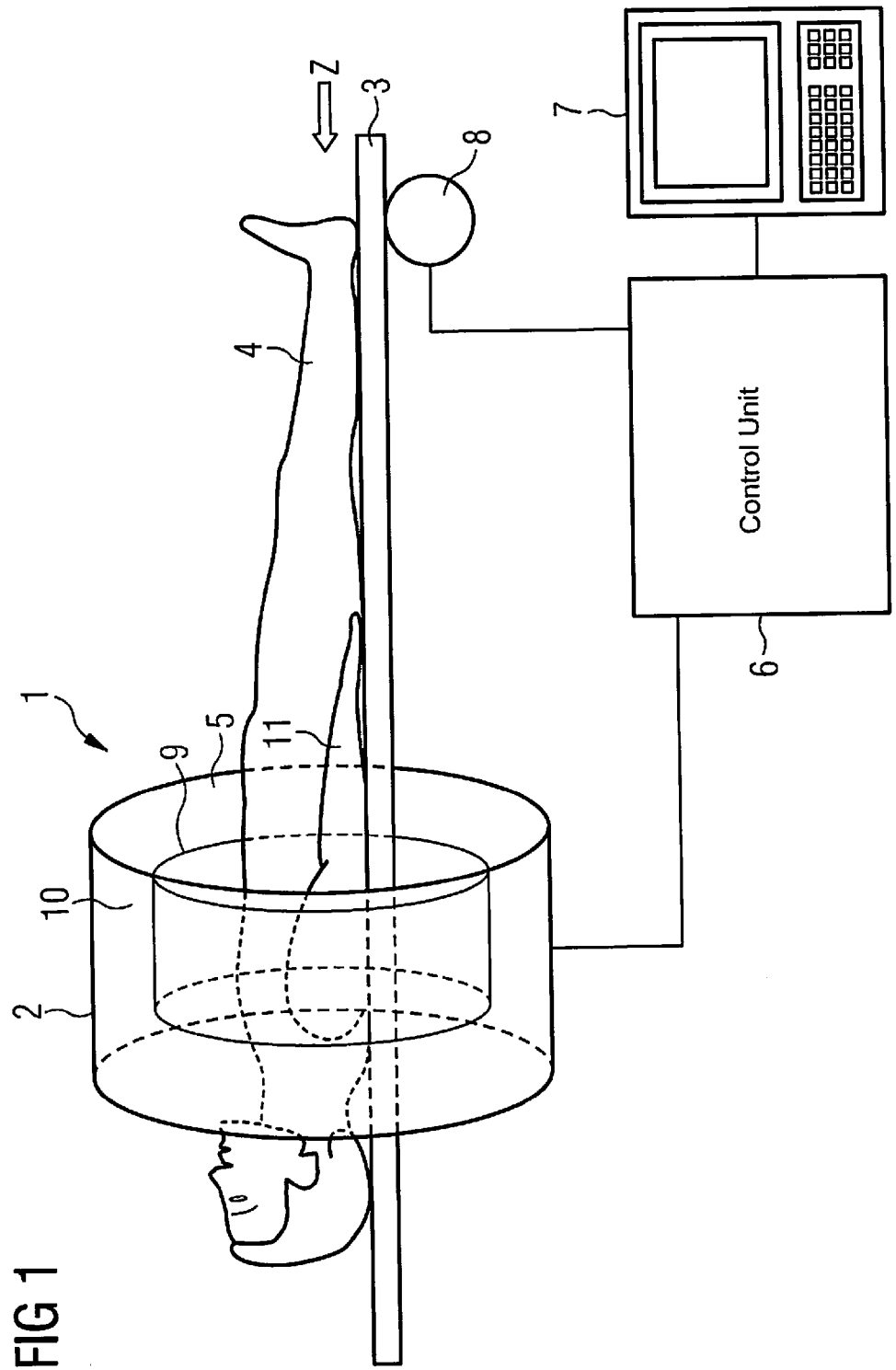
FIG. 1 shows a schematic diagram of a magnetic resonance system in accordance with the form of embodiment of the present invention.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

FIG. 1 shows a magnetic resonance system 1 comprising the actual tomograph 2, an examination table 3 for a patient 4, which is located in an opening 5 of the tomograph 2, a control unit 6, an evaluation facility 7 and a drive unit 8. The control unit 6 controls the tomograph 2 and receives signals from the tomograph 2, which are acquired by the tomograph 2. The control unit 6 also controls the drive unit 8 in order to move the examination table 3 in a direction Z together with the patient through the opening 5 of the tomograph 2. The evaluation facility 7 evaluates the signals recorded by the tomograph 2 to create a magnetic resonance image (MR image). The evaluation facility 7 is typically a computer system with a screen, a keyboard, a pointer device, such as a mouse for example and a data medium on which electronically-readable control information is stored, which is designed such that, when the data medium is used in the evaluation facility 7, it executes the method described below for determining a location of a subarea of a patient in the magnetic resonance system.

The magnetic resonance system 1 is able, within the volume which is delimited by the opening 5 within the tomograph 2, to create a magnetic resonance tomography image. Because of physical-technical shortcomings, such as for example a magnetic field inhomogeneity of a $B_0$ field running in the Z direction and a non-linearity of gradient fields, the volume actually usable for the magnetic resonance images of the magnetic resonance system 1 is limited typically to the volume 9 which extends spherically within the opening 5. As can be seen from FIG. 1, an inner casing area 10 in particular which is located between the usable volume 9 and an inner wall of the tomograph 2, is not able to be used or is only able to be used to a restricted extent because of the previously described physical-technical shortcomings. If the magnetic resonance system 1 is used for determining the location and anatomy of the patient 4, then in order to be used in combination with a positron emission tomograph not shown in the diagram, a determination of the complete anatomy of the patient 4 is however necessary in the direction of the radiation, i.e. especially the anatomy of the patient 4 is also the needed in the inner casing area 10, in order to acquire images of the arms of the patient 4 as well. A human attenuation correction is able to be determined from the acquired anatomy of the patient 4, which is of decisive importance for the evaluation of the positron emission tomography.

Figure 10:
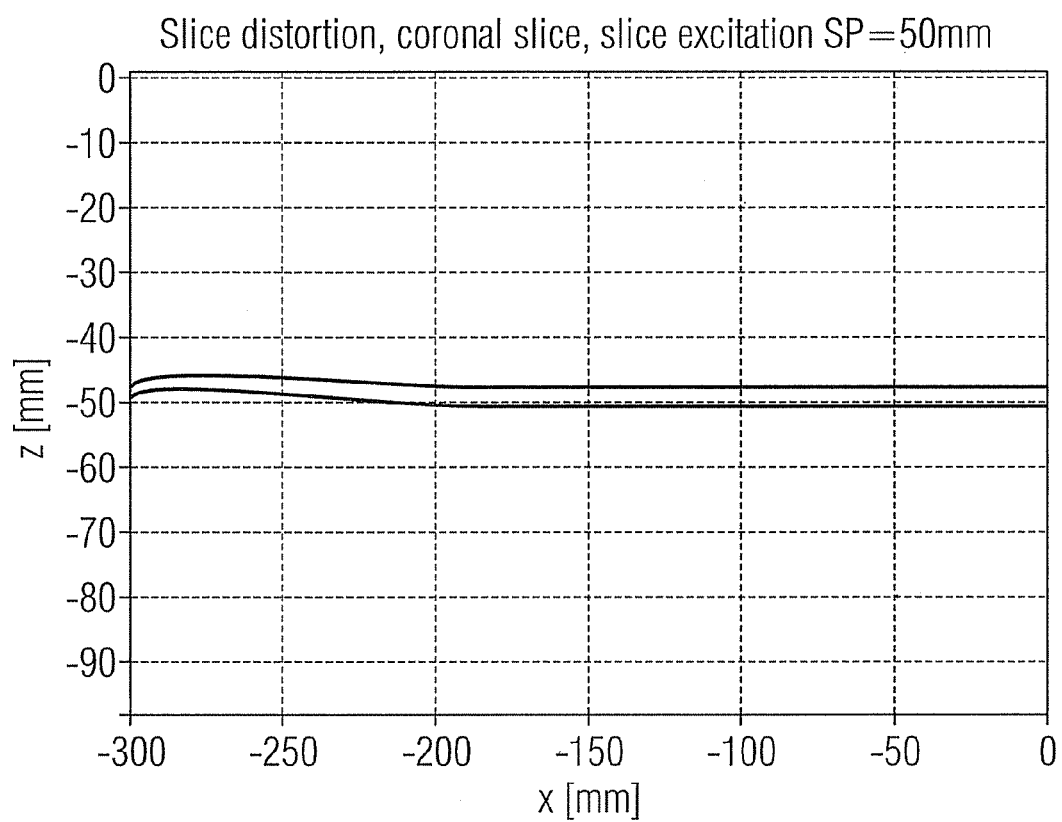
FIG. 10 shows a slice distortion of a coronal slice for a slice excitation at a slice position of −50 mm.
Figure 11:
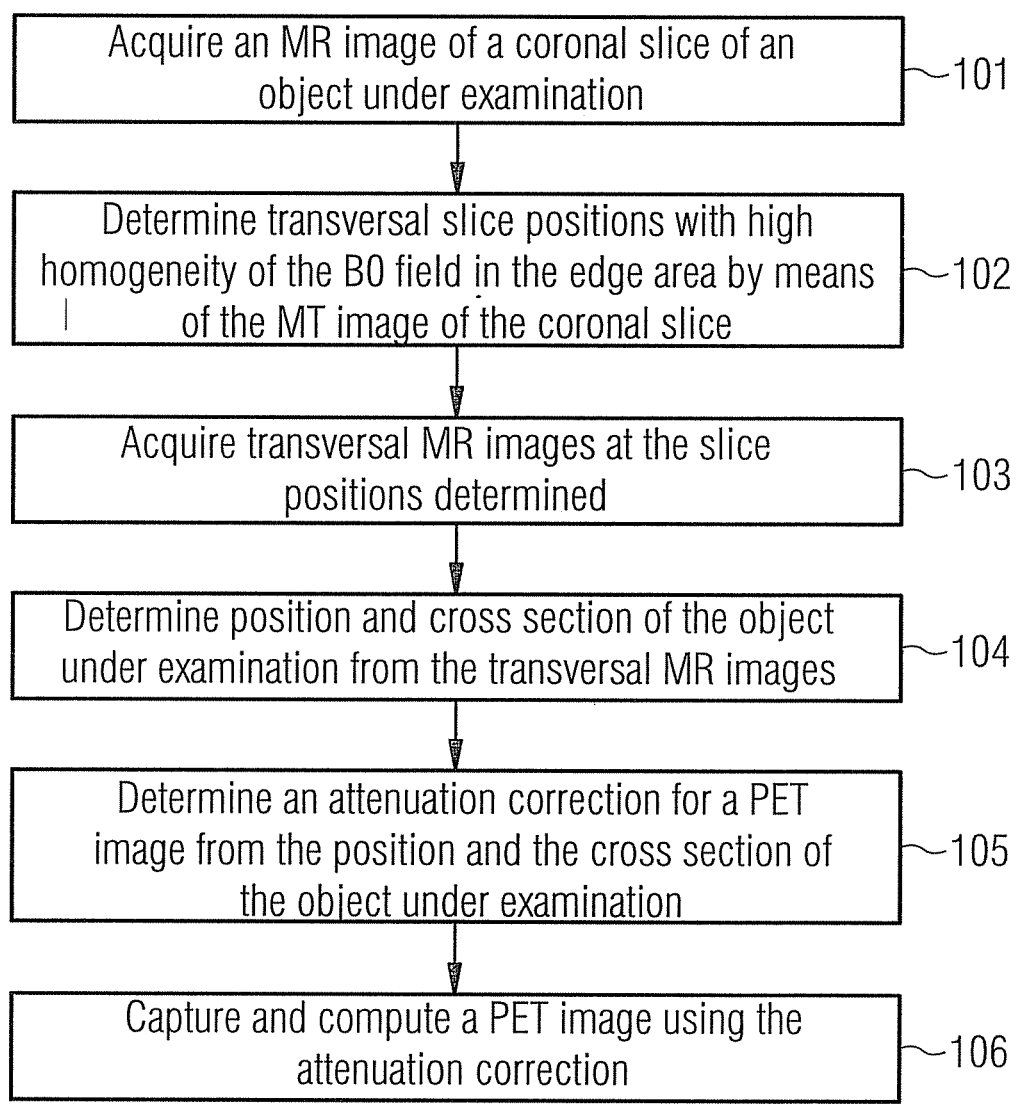
FIG. 11 shows a flow diagram of a method for determining a location of a subarea of an object under examination in a magnetic resonance system in accordance with a form of embodiment of the present invention.

A method for determining the precise anatomy of the patient 4 is described further on in this document with reference to FIG. 11. Before this however a few fundamentals will be illustrated with reference to FIG. 2 through 10, which are of significance for understanding the method described in conjunction with FIG. 11.

Figure 2:
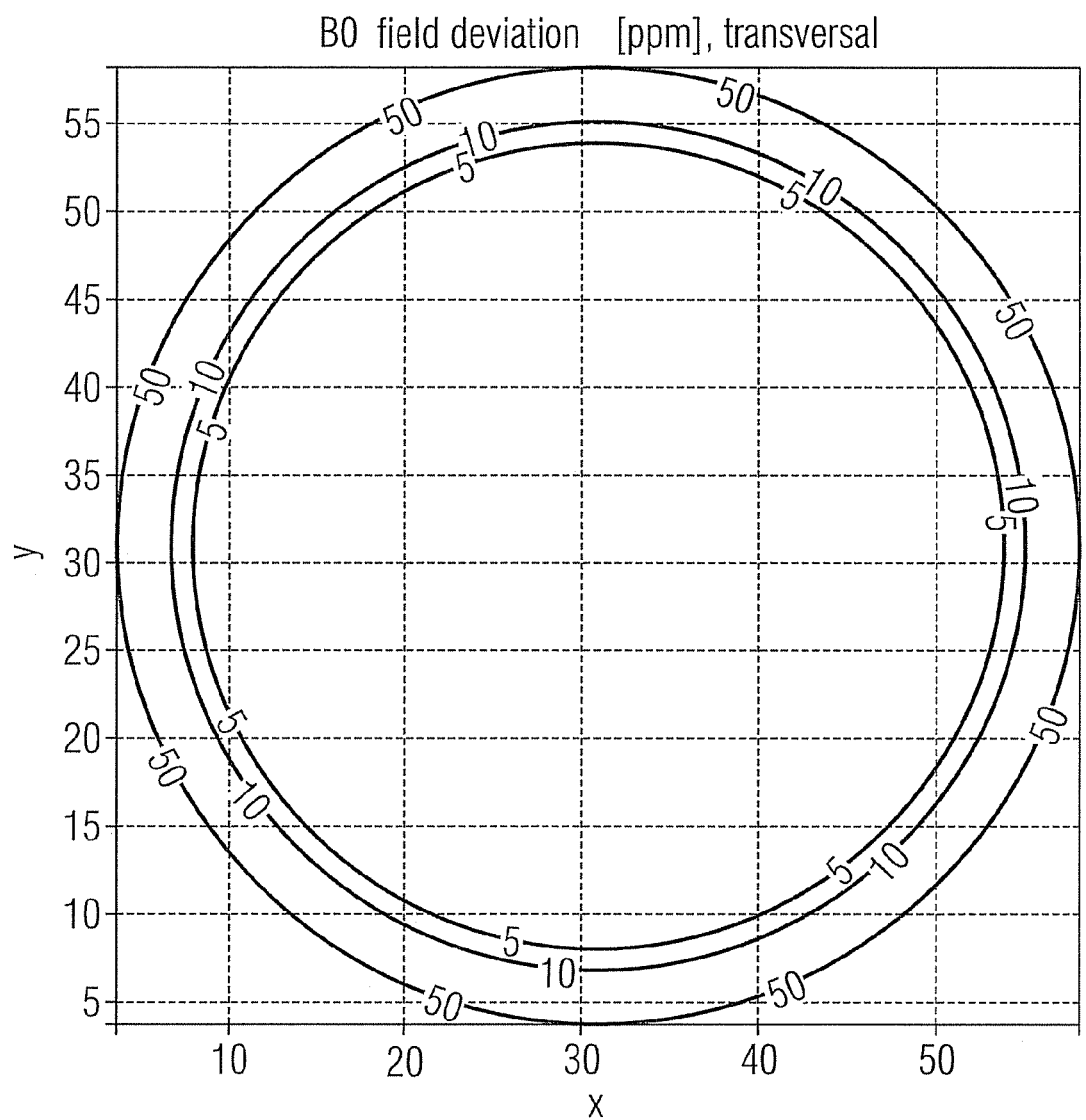
FIG. 2 shows a $B_0$ field deviation in a transversal slice plane of the magnetic resonance system.
Figure 3:
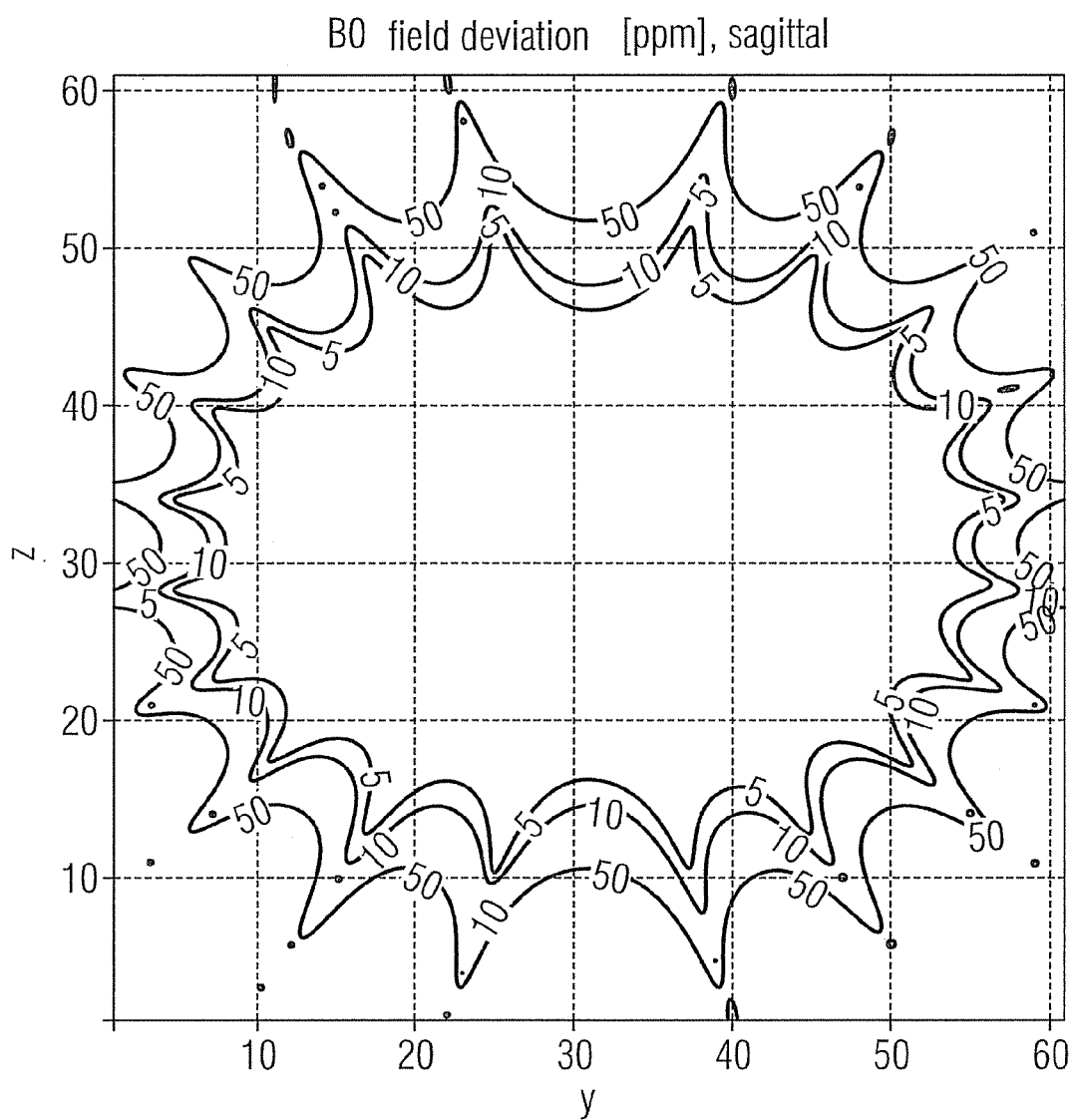
FIG. 3 shows a $B_0$ field deviation in a sagittal slice plane of the magnetic resonance system.
Figure 4:
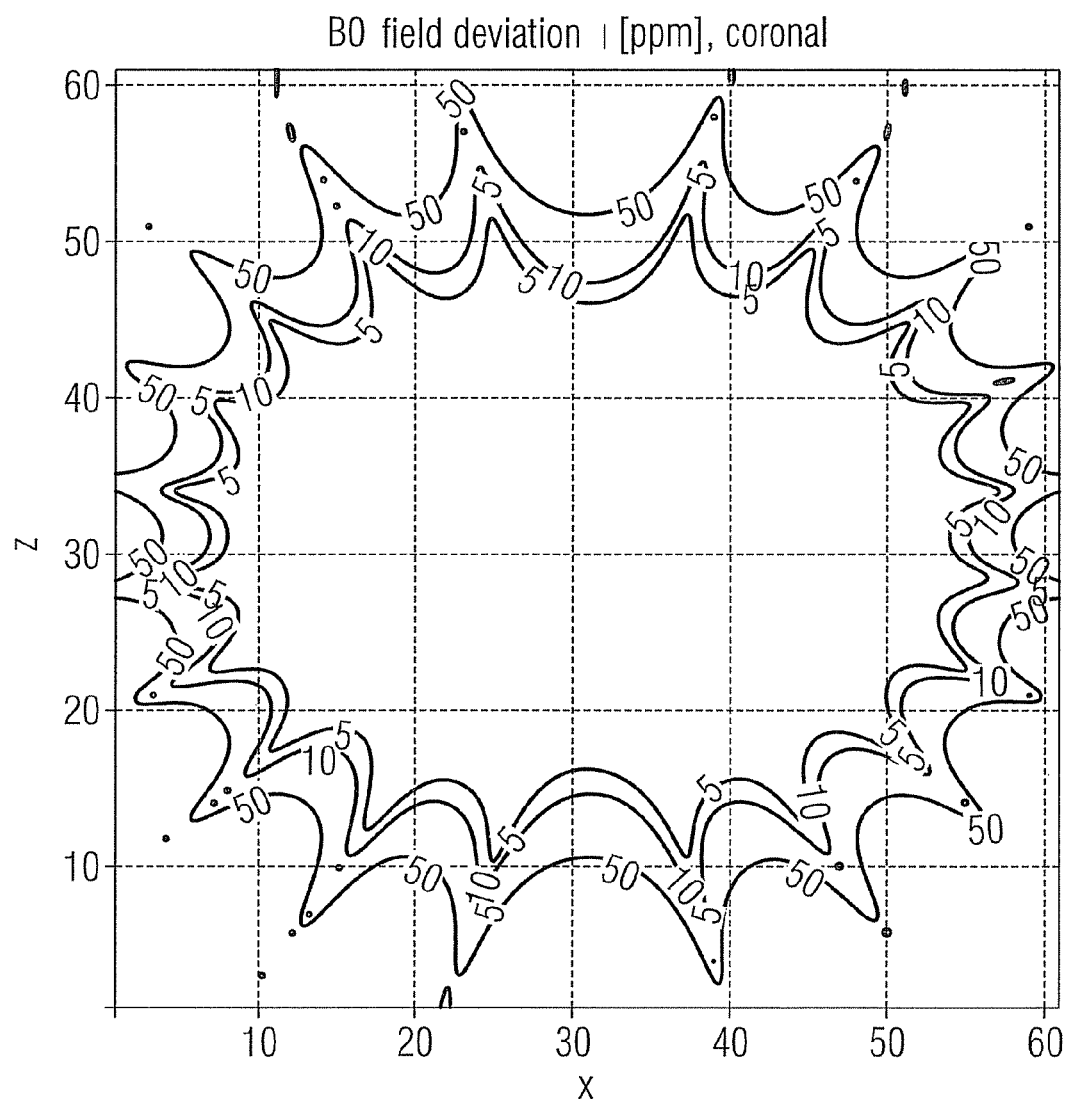
FIG. 4 shows a $B_0$ field deviation in a coronal slice plane of the magnetic resonance system.

A magnetic field inhomogeneity at the outermost edge of the measurable volume, i.e. in the area of the inner casing slice 10 in FIG. 1, leads to a strong distortion of the slice to be measured. FIGS. 2 to 4 show a $B_0$ magnetic field inhomogeneity in different slices. FIG. 2 shows a $B_0$ field deviation in a transversal slice, FIG. 3 a $B_0$ field deviation in a sagittal slice and FIG. 4 a $B_0$ field deviation in a coronal slice. In the $B_0$ field deviation of the transversal slice shown in FIG. 2 three lines are shown with a constant $B_0$ field deviation for a deviation of around 5 ppm, around 10 ppm und around 50 ppm. As can be seen from FIG. 2, the deviation of the $B_0$ field increases significantly in the inner casing area 10, especially in the outermost 5 cm. The thickness of the inner casing slice, in which the $B_0$ field deviation in a transversal slice plane increases significantly, also depends greatly however on the position of the transversal slice in the Z direction. This is clear from the $B_0$ field deviations which are shown in FIG. 3 in the sagittal plane and in FIG. 4 in the coronal plane. As is shown in FIG. 3 and FIG. 4, the magnetic field strength of the $B_0$ field increases and reduces at the edge of the field-of-view of the magnetic resonance system spatially-periodically. The reason for this is usually the arrangement of magnetic field coils in the magnetic resonance system. In the case shown in FIG. 4 five magnetic field coils lead to corresponding magnetic field increases (in the coronal representation on the left and right side respectively) close to these coils and to the magnetic field reductions between the magnetic field coils. This results in the periodic magnetic field behavior shown. The magnetic field is comparatively homogeneous between the described increases and reductions and makes it possible to acquire an image of a slice here in an expanded field-of-view including the edge. Thus there are positions in which the $B_0$ field deviation in the direction of the outer edge is only very small and other positions in which the $B_0$ field deviation already deviates significantly at some distance from the edge of the opening 5. If an MR image is acquired in a transversal slice, in which the deviation of the $B_0$ field in the inner casing area 10 is very small, a reduced slice curvature is produced in this area so that a faithful image of the patient 4 is also possible in the inner casing area 10 in these slices.

Figure 5:
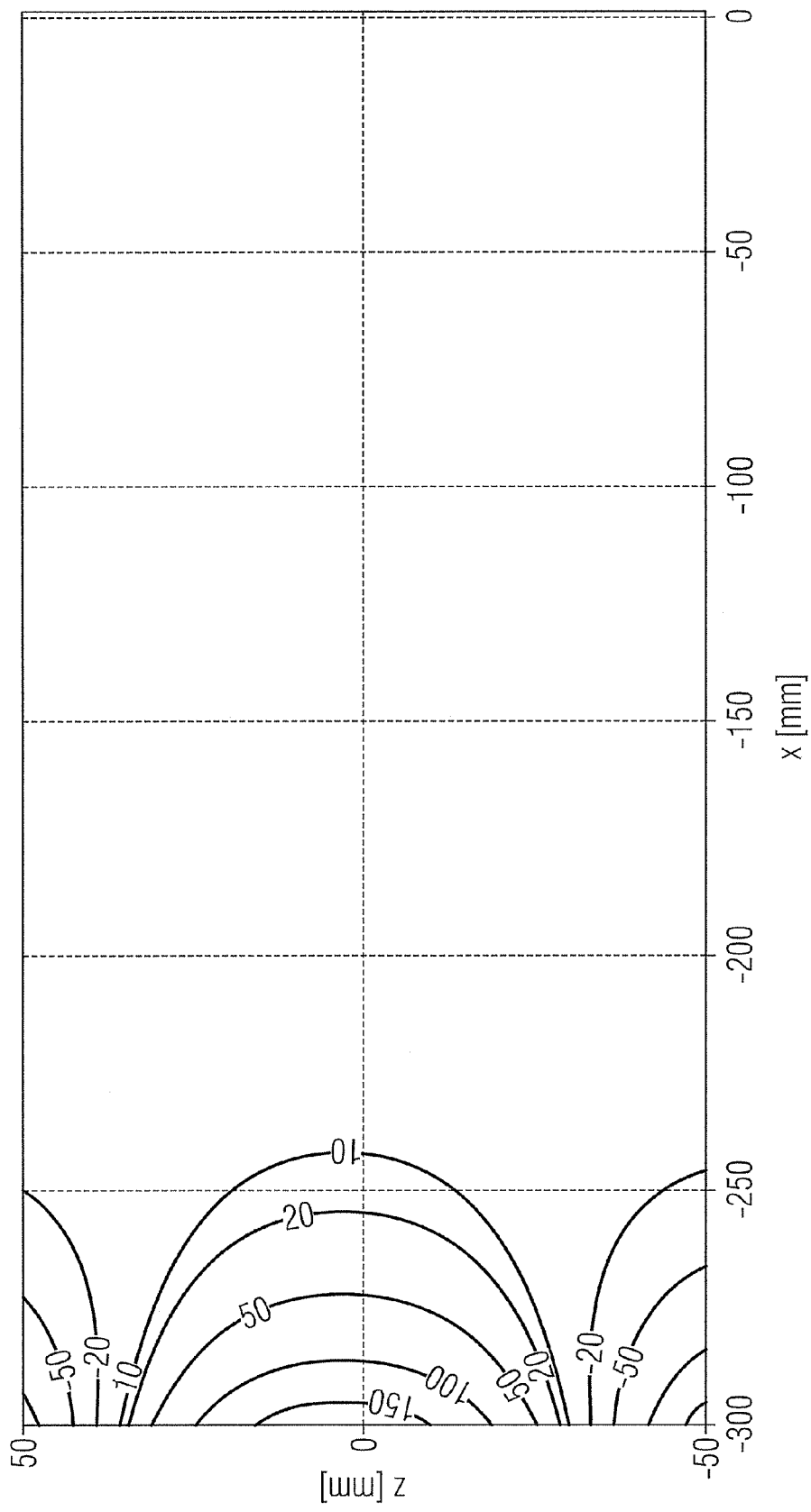
FIG. 5 shows a $B_0$ field deviation in a coronal slice plane close to the isocenter of the magnetic resonance system.
Figure 6:
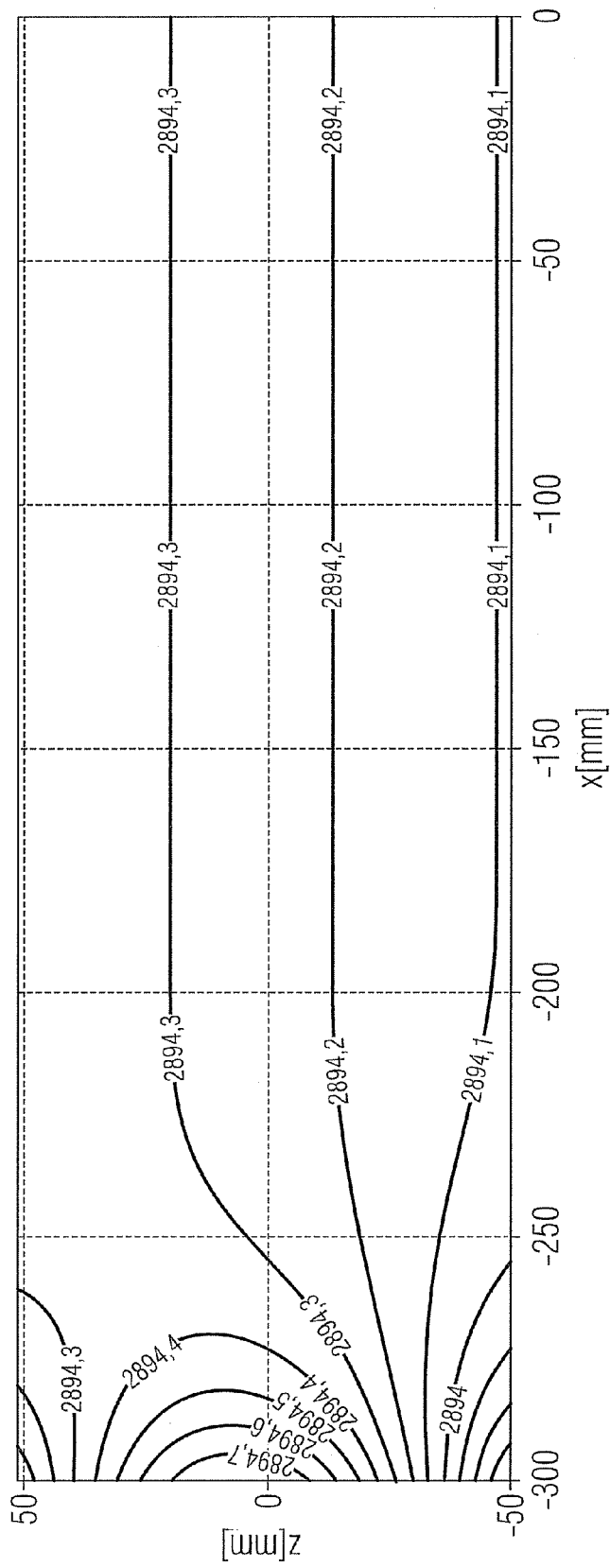
FIG. 6 shows a $B_0$ field with an overlaid gradient field in a coronal layer close to the isocenter of the magnetic resonance system.
Figure 7:
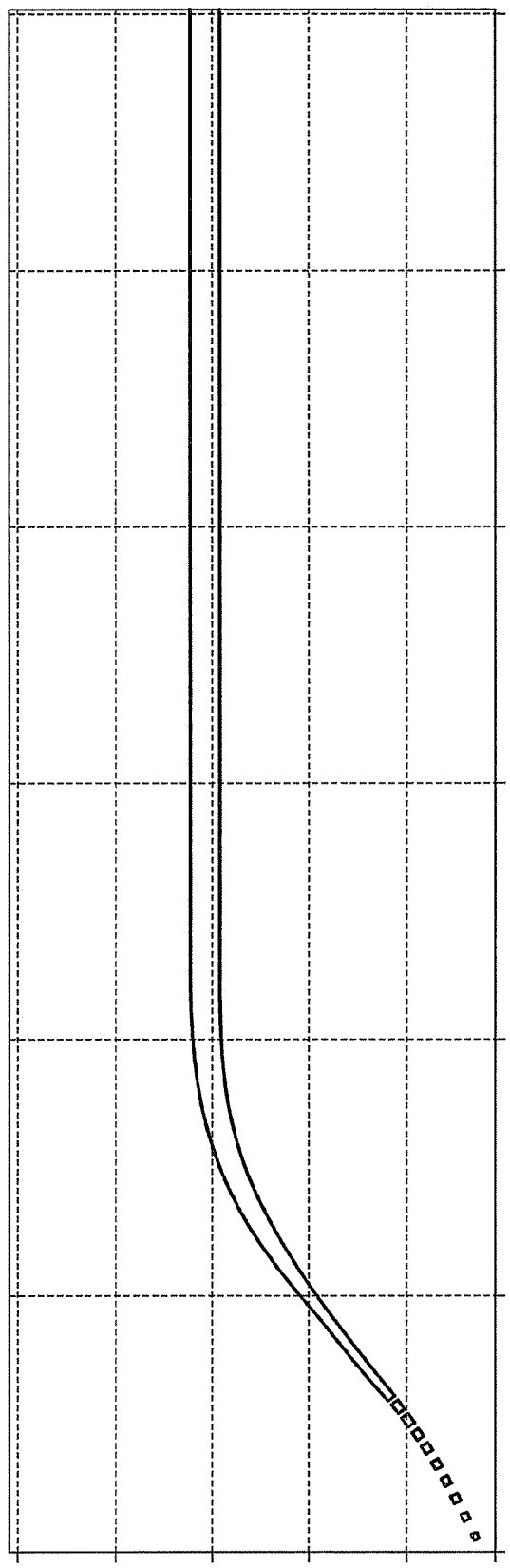
FIG. 7 shows a slice distortion of a coronal slice for a slice excitation at a slice position at 0 cm.

In FIGS. 5 to 7 the problem of slice distortion is shown in detail. FIG. 5 shows a $B_0$ field deviation of a coronal slice close to the isocenter. The $B_0$ field deviation is represented in the form of lines with constant $B_0$ field deviation (10 ppm, 20 ppm, 50 ppm, 100 ppm and 150 ppm). The diagram shown in FIG. 5 essentially corresponds to a diagram of an extract of the $B_0$ field deviation of FIG. 4.

FIG. 6 shows the $B_0$ field of FIG. 5, which is overlaid with an ideally slice-selective Z-gradient field of 3 mT/m, whereby an individual transversal slice is excited in the isocenter. As can be seen from FIG. 6, lines of the same magnetic field strength (2894.1, 2498.2 and 2894.3) in the edge area, i.e. in the area of x=−200 mm to x=−300 mm are heavily distorted. The result is a heavy slice distortion shown in FIG. 7 at the edge as a result of the $B_0$ field inhomogeneity.

Figure 8:
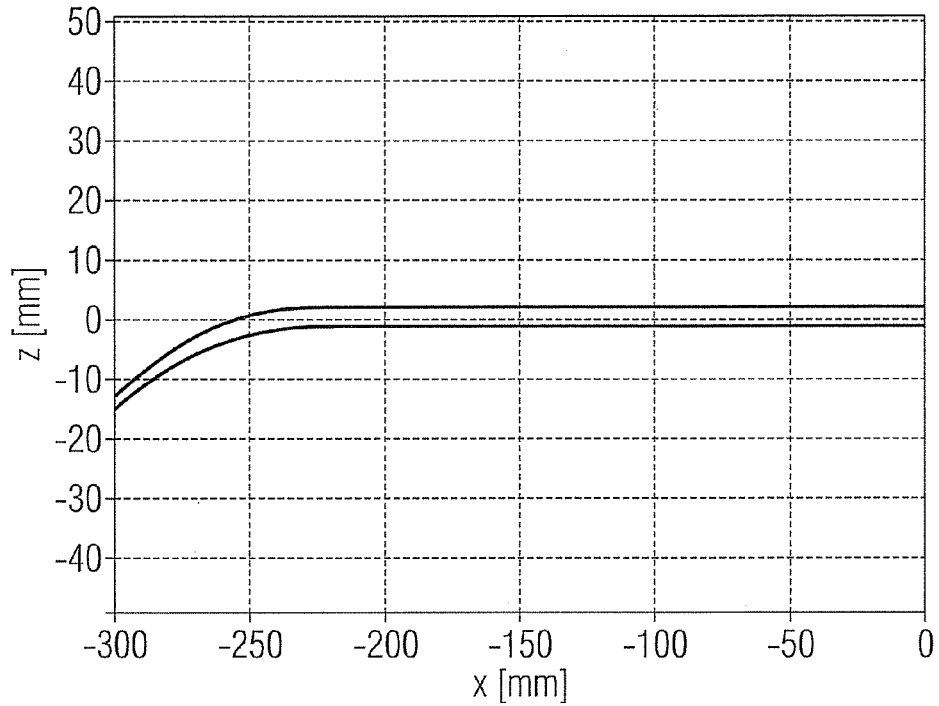
FIG. 8 shows a slice distortion of a coronal slice for a slice excitation at a slice position of 0 mm.
Figure 9:
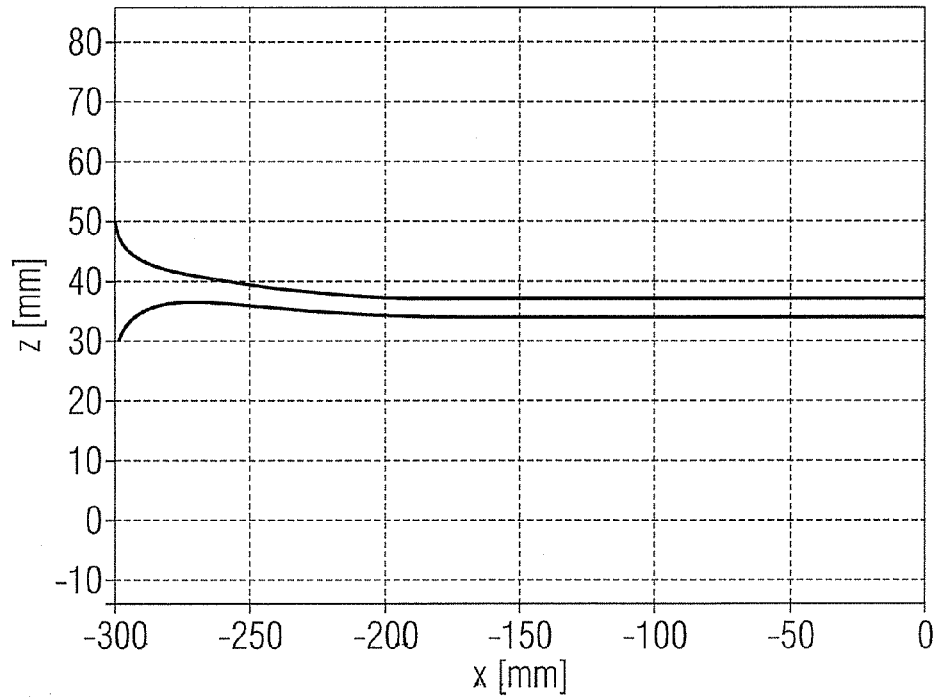
FIG. 9 shows a slice distortion of a coronal slice for a slice excitation at a slice position of 35 mm.

Referring to FIGS. 8 to 10, it becomes clear that the slice distortion is greatly dependent on the slice position. FIG. 8 shows a slice distortion for a slice position at Z=0 mm where, in accordance with FIGS. 5 and 6, a strong $B_0$ field deviation obtains and thereby a strong curvature of the coronal slice occurs. FIG. 9 shows the slice distortion of a coronal slice for a slice excitation of a slice position at Z=35 mm, where in accordance with FIGS. 5 and 6 a relatively low $B_0$ field deviation exists in the edge area, i.e. in the inner casing area 10. FIG. 10 shows a corresponding slice distortion of a coronal slice for a slice excitation at Z=−50 mm. Also evident in FIG. 9 is a tendency for the slice to expand and in FIG. 10 a compaction of the slice at the edge. An expansion is generally to be preferred to a compaction, since otherwise a loss of information can occur. This is dependent on the slice position and the gradient polarity.

As has been described in conjunction with FIGS. 2 to 10, it is possible, with a suitable selection of the slice positions, to create individual transversal MR slice images which make possible a faithful image of an object under examination such as the patient 4 for example right into the edge area of the field-of-view of the magnetic resonance system. Thus, in an inventive method, as is shown in FIG. 11, in a first step 101 an image of a coronal slice of the object under examination of the patient 4 is acquired. In this case it is sensible for the readout direction (which is frequency-encoded) of the coronal slice to select the same direction as the slice selection direction (which is likewise frequency-encoded) of the MR image in the transversal slice to be acquired later in step 103. This makes the bending of the MR image to be recorded in step 103 already visible in the coronal slices and is able to be taken into account in the planning.

In step 102 the slice positions for transversal slice images are determined in which a large homogeneity of the $B_0$ field in the edge area exists. These slice positions are determined in the MR image of the coronal slice by positions being searched for in the inner casing area in the coronal slice image which have a high signal level, since at these positions the homogeneity of the $B_0$ field is at its highest. As an alternative or in addition, the transversal slice positions with high homogeneity of the $B_0$ field in the edge area can also be determined in a previously determined $B_0$ field distribution, as has been described for example in conjunction with FIGS. 2 to 4. The dimensioning of the $B_0$ field can for example be recorded once during the production of the magnetic resonance system 1 for different operating states and stored in the control unit 6 or the evaluation facility 7. It is also possible to acquire a 3D volume image and to determine suitable transversal slice positions in this image.

In step 103 MR images are then acquired in the transversal slices at the slice positions determined and in step 104 the position and the cross section of the object under examination is determined in the acquired MR images. Furthermore MR images can also be acquired in slices which run at an angle, i.e. which extend both in the transversal direction and also in the sagittal direction, in order for example to acquire MR images in the expanded field-of-view at a greater distance in the Z direction from the isocenter.

By including prior knowledge, such as the fact that the structure of an arm of the patient 4 is substantially a cylindrical structure for example, which extends continuously between a number of spaced transversal MR slice images, in step 104 the position and the cross section of the overall object under examination is typically determined by interpolation. In step 105, taking into account the position and the cross section of the object under examination 4, an attenuation correction for a PET image can be determined. In step 106 PET images are then acquired and computed using the previously determined attenuation correction.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combineable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, non-transitory computer readable medium and non-transitory computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a non-transitory computer readable medium and is adapted to perform any one of the aforementioned methods when run on a computer device (a device including a processor). Thus, the non-transitory storage medium or non-transitory computer readable medium, is adapted to store information and is adapted to interact with a data processing facility or computer device to execute the program of any of the above mentioned embodiments and/or to perform the method of any of the above mentioned embodiments.

The non-transitory computer readable medium or non-transitory storage medium may be a built-in medium installed inside a computer device main body or a removable non-transitory medium arranged so that it can be separated from the computer device main body. Examples of the built-in non-transitory medium include, but are not limited to, rewriteable non-volatile memories, such as ROMs and flash memories, and hard disks. Examples of the removable non-transitory medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

LIST OF REFERENCE CHARACTERS

1 Magnetic resonance system
2 Tomograph
3 Examination table
4 Object under examination, patient
5 Opening
6 Control unit
7 Evaluation facility
8 Drive unit
9 Field-of-view usually used
10 Inner casing area
11 Subarea of the object under examination, arm
101-106 Step

What is claimed is:

1. A method for determining a location of a subarea of an object under examination in a magnetic resonance system, the subarea being arranged at an edge of a field-of-view of the magnetic resonance system, the method comprising:
   determining at least one slice position for an MR image, in which a field at the edge of the MR image fulfills a homogeneity criterion;
   acquiring an MR image in the determined at least one slice position, the acquired MR image containing the subarea at the edge of the field-of-view; and
   determining the location of the subarea of the object under examination through a location of the subarea in the acquired MR image.

2. The method as claimed in claim 1, wherein the MR image is acquired in a first slice plane and wherein, to determine the at least one slice position for the MR image in which the field at the edge of the MR image fulfils the homogeneity criterion, a further MR image is acquired in a second slice plane and in the further MR image, at least one slice position for the MR image is determined in which signal values at the edge of the further MR image fulfill a signal value criterion.

3. The method according to claim 2, wherein the second slice plane is a plane of the object under examination.

4. The method as claimed in claim 1, wherein, the step of determining the at least one slice position for the MR image in which the field at the edge of the MR image fulfills the homogeneity criterion includes:
   acquiring a number of MR images in slice planes parallel to the plane of the MR image; and
   determining the at least one slice position for the MR image as a function of slice positions of those of the number of MR images in which signal values at the edge fulfill a signal value criterion.

5. The method as claimed in claim 2, wherein the signal values at the edge which exceed a threshold value fulfill the signal value criterion.

6. The method as claimed in claim 2, wherein the signal values at the edge which have a signal value relationship to adjacent signal values fulfill the signal value criterion.

7. The method according to claim 1, wherein, for determining the at least one slice position for the MR image in which the field at the edge of the MR image fulfils the homogeneity criterion, a field distribution in the field of view including the edge of the field of view is determined.

8. The method as claimed in claim 1, wherein the subarea of the object under examination includes an anatomical structure of a patient which is arranged at the edge of the field-of-view of the magnetic resonance system.

9. The method as claimed in claim 8, wherein the anatomical structure includes an arm of the patient.

10. The method as claimed in claim 1, wherein the magnetic resonance system includes a tunnel-shaped opening to accommodate the object under examination, with the edge of the field-of-view comprising an inner casing area along an inner surface of the tunnel-shaped opening.

11. The method as claimed in claim 10, wherein the inner casing area has an inner casing thickness of approximately 5 cm.

12. The method as claimed in claim 1, wherein the MR image is acquired in a transversal plane.

13. The method as claimed in claim 1, wherein the attenuation correction for a positron emission tomography is determined as a function of the specified location of the subarea of the object under examination.

14. A magnetic resonance system, comprising:
   a magnetic resonance system including
      a control unit to control a tomograph with a magnet for generating a field in a field-of-view of the magnetic resonance system, and to receive signals detected by the tomograph, and
      an evaluation facility to evaluate the received signals and to create MT images, wherein the magnetic resonance system is embodied to
   determine at least one slice position for an MR image in which a field at an edge of the MR image fulfills a homogeneity criterion, acquire an MR image in the at least one slice position determined, the acquired MR image containing a subarea of an object under examination at an edge of a field-of-view of the magnetic resonance system, and determine a location of the subarea of the object under examination through a location of the subarea in the acquired MR image.

15. The magnetic resonance system as claimed in claim 14, wherein the magnetic resonance system also includes a positron emission tomograph, wherein the attenuation correction for a positron emission tomography is determined as a function of the specified location of the subarea of the object under examination.

16. A computer program product, capable of being loaded directly into a memory of a programmable control unit of a magnetic resonance system, comprising program code for executing a method, for determining a location of a subarea of an object under examination in the magnetic resonance system, the subarea being arranged at an edge of a field-of-view of the magnetic resonance system, when the program is executed in the programmable control unit of the magnetic resonance system, the method comprising:
   determining at least one slice position for an MR image, in which a field at the edge of the MR image fulfills a homogeneity criterion;
   acquiring an MR image in the determined at least one slice position, the acquired MR image containing the subarea at the edge of the field-of-view; and determining the location of the subarea of the object under examination through a location of the subarea in the acquired MR image.

17. An electronically-readable data medium including electronically-readable control information stored thereon, which is embodied, when the data medium is used in a control unit of a magnetic resonance system, to execute a method for determining a location of a subarea of an object under examination in the magnetic resonance system, the subarea being arranged at an edge of a field-of-view of the magnetic resonance system, the method comprising:
   determining at least one slice position for an MR image, in which a field at the edge of the MR image fulfills a homogeneity criterion;
   acquiring an MR image in the determined at least one slice position, the acquired MR image containing the subarea at the edge of the field-of-view; and
   determining the location of the subarea of the object under examination through a location of the subarea in the acquired MR image.

18. A non-transitory computer readable medium including program segments for, when executed in a control unit of a magnetic resonance system, causing the control unit to implement a method, for determining a location of a subarea of an object under examination in the magnetic resonance system, the subarea being arranged at an edge of a field-of-view of the magnetic resonance system, when the program is executed in the programmable control unit of the magnetic resonance system, the method comprising:
   determining at least one slice position for an MR image, in which a field at the edge of the MR image fulfills a homogeneity criterion;
   acquiring an MR image in the determined at least one slice position, the acquired MR image containing the subarea at the edge of the field-of-view; and
   determining the location of the subarea of the object under examination through a location of the subarea in the acquired MR image.

19. The method as claimed in claim 4, wherein the signal values at the edge which exceed a threshold value fulfill the signal value criterion.

20. The method as claimed in claim 4, wherein the signal values at the edge which have a signal value relationship to adjacent signal values fulfill the signal value criterion.

\* \* \* \* \*